(12) United States Patent
Sengupta et al.

(10) Patent No.: US 8,217,457 B1
(45) Date of Patent: Jul. 10, 2012

(54) ELECTROSTATIC DISCHARGE (ESD) PROTECTION DEVICE FOR USE WITH MULTIPLE I/O STANDARDS

(75) Inventors: Samit Sengupta, San Jose, CA (US); Cheng-Hsiung Huang, Cupertino, CA (US); Wei-Guang Wu, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/272,042

(22) Filed: Nov. 17, 2008

Related U.S. Application Data

(62) Division of application No. 11/605,516, filed on Nov. 28, 2006, now Pat. No. 7,468,617.

(60) Provisional application No. 60/741,520, filed on Nov. 30, 2005.

(51) Int. Cl.
*H01L 23/62* (2006.01)

(52) U.S. Cl. ................... 257/355; 257/E29.015

(58) Field of Classification Search .............. 326/136; 257/357–362, 409, 489–490, 495
See application file for complete search history.

(56) References Cited

U.S. PATENT DOCUMENTS

| | | | |
|---|---|---|---|
| 6,232,163 B1* | 5/2001 | Voldman et al. | 438/212 |
| 6,355,962 B1* | 3/2002 | Liang et al. | |
| 6,465,768 B1* | 10/2002 | Ker et al. | |
| 6,498,357 B2* | 12/2002 | Ker et al. | |
| 6,806,160 B2* | 10/2004 | Ker et al. | |
| 6,979,869 B2* | 12/2005 | Chen et al. | 257/356 |
| 7,176,529 B2* | 2/2007 | Ohguro | |
| 7,384,854 B2* | 6/2008 | Voldman | |
| 7,582,938 B2* | 9/2009 | Chen | 257/357 |
| 7,671,416 B1* | 3/2010 | O et al. | |
| 7,696,580 B2* | 4/2010 | Chen et al. | |
| 7,701,012 B2* | 4/2010 | Xu et al. | 257/355 |
| 2002/0070408 A1* | 6/2002 | Schnaitter | 257/356 |
| 2003/0168701 A1* | 9/2003 | Voldman | |
| 2006/0289936 A1* | 12/2006 | Kao | |
| 2008/0217729 A1* | 9/2008 | Disney et al. | |
| 2009/0140340 A1* | 6/2009 | Kao | |
| 2009/0294856 A1* | 12/2009 | Chen | |

* cited by examiner

*Primary Examiner* — Shawki S Ismail
*Assistant Examiner* — Thienvu Tran
(74) *Attorney, Agent, or Firm* — Ward & Zinna, LLC

(57) ABSTRACT

In one aspect, the present invention comprises an electrostatic discharge (ESD) protection circuit comprising a plurality of input circuits in which each input circuit comprises a first PMOS and a first NMOS transistor connected in series between a power supply and ground and first and second inverters connected to the gates of the first PMOS and NMOS transistors. Each inverter connected to the gate of the first NMOS transistor comprises a second NMOS transistor connected between that gate and ground and the ratio of the width of the gate of the second NMOS transistor to the width of the gate of the first NMOS transistor of each of the input circuits is substantially the same. In another aspect of the invention, a multi-fingered gate transistor is formed in a first well of one conductivity type that is surrounded by a second well of the same conductivity type from which it is separated by a shallow trench isolation and a portion of the substrate. The second well is used as a tap for the first well with a significant increase in the resistance of the substrate current path. A process for forming this structure is a further aspect of the invention.

19 Claims, 8 Drawing Sheets

ELECTROSTATIC DISCHARGE (ESD) PROTECTION DEVICE FOR USE WITH MULTIPLE I/O STANDARDS

CROSS REFERENCE TO RELATED APPLICATIONS

This application is a divisional of application Ser. No. 11/605,516 filed Nov. 28, 2006 now U.S. Pat. No. 7,468,617 which claims the benefit and priority of U.S. Provisional Application No. 60/741,520, filed Nov. 30, 2005 and entitled "Electrostatic Discharge (ESD) Protection Device For Use With Multiple I/O Standards," the entire contents which are incorporated herein by virtue of this reference.

FIELD OF THE INVENTION

This relates to electrostatic discharge (ESD) protection devices for protecting an integrated circuit from ESD damage.

BACKGROUND OF THE INVENTION

N-type metal-oxide-silicon (NMOS) transistors such as transistor 100 of FIG. 1 are a frequent choice for ESD protection circuits for integrated circuits. Transistor 100 comprises N-type source and drain regions 110, 120 in a P-type well 130 in substrate 140, an insulating layer 150 on the substrate and a gate 160 on the insulating layer between the source and drain regions. Sidewall spacers 162 are located on each side of gate 160; and lightly doped drain (LDD) regions 170, 180 extend part way under the gate from the source and drain regions. Transistor 100 operates to provide ESD protection by triggering a parasitic lateral bipolar transistor 190 inherent in the MOS structure where the source and drain regions 110, 120 of the MOS transistor constitute the emitter and collector of the lateral bipolar transistor and the well 130 constitutes the base. See, for example, A. Amerasekera et al., *ESD in Silicon Integrated Circuits*, pp. 81-95 (2d Ed., Wiley, 2002).

In an integrated circuit (IC), a typical implementation of a MOS transistor is as a multi-fingered gate structure 200 such as that shown in a top view in FIG. 2A and in cross-section in FIG. 2B taken along line B-B of FIG. 2A. For convenience, only four of the fingers of the device of FIG. 2A have been shown in FIG. 2B. Structure 200 comprises N-type source and drain regions 210, 220 in a P-well 230 in substrate 240, an insulating layer 250 on the substrate and a multi-fingered gate 260 on the insulating layer. LDD regions 270, 280 extend part way under each gate finger. Structure 200 further includes a P-well tap 290 on the periphery of the structure and a shallow trench isolation region 252 between the source and drain regions and the P-well tap. The source regions 210 are connected together by a connector 215 that is typically formed in a metallization layer on the IC; the drain regions 220 are connected together by a connector 225 also formed in a metallization layer on the IC; and the gate fingers are connected together by a connector 265 also formed in a metallization layer on the IC. As a result, the source regions, drain regions and gate fingers are connected in parallel. The dimension L is the gate length; the dimension W is the width of a gate finger. Since the source regions, drain regions and fingers are connected in parallel, the total gate width of the transistor is the product of W and the number of fingers, or 8 W for the device shown in FIG. 2A.

One type of circuit in which the NMOS transistor is used for ESD protection is a circuit such as circuit 300 of FIG. 3 that is designed for use with multiple I/O standards. Different I/O standards have been developed to interface with memories, microprocessors, backplanes and peripheral devices that use different power supply voltages, signaling protocols or terminations.

Examples of the different I/O standards include:
- LVTTL which is defined by JEDEC Standard JESD 8-A, Interface Standard for Nominal 3.0V/3.3V Supply Digital Integrated Circuits,
- LVCMOS which is defined by JEDEC Standard JESD 8-A, Interface Standard for Nominal 3.0V/3.3V Supply Digital Integrated Circuits;
- 2.5V which is documented by JEDEC Standard JESD 8-5, 2.5V±0.2V (Normal Range) and 1.7V to 2.7V (Wide Range) Power Supply Voltage and Interface Standard for Nonterminated Digital Integrated Circuit;
- 1.8V which is documented by JEDEC Standard JESD 8-7, 1.8V±0.15 (Normal Range) and 1.2V to 1.95V (Wide Range) Power Supply Voltage and Interface Standard for Nonterminated Digital Integrated Circuit;
- 3.3V PCI which is defined in PCI Local Bus Specification Revision 2.2;
- LVDS which is defined in IEEE 1596.3 SCI-LVDS and ANSI/TIA/EIA-644;
- HSTL Class I, which is specified by JEDEC Standard JESD 8-6, High-Speed Transceiver Logic (HSTL);
- SSTL-2, Class I & II, which is specified by JEDEC Standard JESD 8-9, Stub-Series Terminated Logic for 2.5 Volts (SSTL-2);
- SSTL 3 Class I & II, which is specified by JEDEC Standard JESD 8-8, Stub-Series Terminated Logic for 3.3 Volts (SSTL-3);
- CCT which is specified by JEDEC Standard JESD 8-4, Center-Tap-Terminated (CTT) Low-Level, High-Speed Interface Standard for Digital Integrated Circuits.

Circuit 300 comprises a plurality of input circuits 310A, 310B, . . . 310N connected in parallel to a power supply bus 370, an input/output (I/O) bus 380 and ground 390. Each input circuit is used with a different I/O standard. Each input circuit comprises a pair of inverters 320, 322, an NMOS transistor 350 and a PMOS transistor 360. NMOS transistor 350 is structurally similar to transistor 200 of FIGS. 2A and 2B and comprises N-type source 351 and drain regions 352 in a P-type well and a gate 356. Source 351 is connected to ground 390 and drain 352 is connected to I/O bus 380. PMOS transistor 360 is structurally similar to transistor 200 but has opposite conductivity type. Thus, in addition to a gate 366, it has P-type source and drain regions 361, 362 in an N-type well. Source 361 is connected to the power supply bus 370 and drain 362 is connected to I/O bus 380. While each of the input circuits 310A, 310B, . . . 310N is depicted in FIG. 3 as having the same topology, a major difference among the input circuits is in the size of transistors 350 and 360 which varies from one circuit to another. Since it is advantageous to use the same gate length in all the transistors in the integrated circuit, this variation in size is achieved by varying the gate width of the transistors in the different input circuits.

Each of inverters 320, 322 typically comprises an NMOS transistor 330 and a PMOS transistor 340 connected in series between power supply bus 370 and ground 390. For convenience, only transistors 330 and 340 of inverter 320 are shown in FIG. 3. The transistors of inverter 322 will be understood to be similar. NMOS transistor 330 comprises a source 331, a drain 332 and a gate 336. Similarly, PMOS transistor 340 comprises a source 341, a drain 342 and a gate 346. Source 331 is connected to ground 390 and drain 332 is connected to an output node 339. Source 341 is connected to power supply bus 370 and drain 342 is connected to output node 339. Gates 336 and 346 are connected to an input node 338. Output node 339 is connected to gate 356 of NMOS transistor 350. Similarly, inverter 322 has an input node 348 connected to the gates of its PMOS and NMOS transistors and an output node 349 connected to gate 366 of PMOS transistor 360. The size of the transistors in inverters 320, 322 is typically the same in each input circuit.

As noted above, to accommodate different I/O standards, the size of the NMOS and PMOS transistors 350, 360 in input circuits 310A, 310B, . . . 310N is varied. This variation in size is considerable; and in some commercially available multiple I/O standards circuits the NMOS transistor in one input circuit may have a gate width that is as large as the sum of the gate widths of the NMOS transistors in all the other input circuits. When the NMOS transistors 350 are used for ESD protection, their variation in size ordinarily results in the largest NMOS transistor turning on before the other transistors. As a result, the ESD pulse is discharged through that transistor alone. This has the effect of limiting the ESD protection capabilities of the circuit to what can be discharged through the one largest transistor.

Additional limitations on ESD protection capabilities arise from the structure of the transistor itself. As is apparent from FIGS. 2A and 2B, there is considerable variation in distance between the P-well tap 290 and the different gate fingers of the multi-fingered transistor. As a result, the electric potential of the well under the different gate fingers varies from one finger to another. Since the triggering of the parasitic bipolar transistor depends on forward biasing the P-N junction between the P-type well and the N-type source region, the potential at some portions of the multi-fingered structure may not be enough to trigger the parasitic transistor in those portions. As a result, triggering of the transistor tends to be non-uniform with the result that the transistor is not able to discharge as large an ESD pulse as it could if triggering were substantially uniform across the entire multi-fingered structure. Conventional efforts to increase the potential under the gate fingers usually involve increasing the distance between these regions and the P-well tap. The penalty for this, however, is an increase in the size of the transistor.

SUMMARY OF THE PRESENT INVENTION

In one aspect, the present invention comprises an electrostatic discharge (ESD) protection circuit comprising a plurality of input circuits in which each input circuit is connected in parallel to a power supply bus, an input/output (I/O) bus and ground. Each input circuit comprises a first PMOS and a first NMOS transistor connected in series between the power supply and ground and first and second inverters connected to the gates of the first PMOS and NMOS transistors. The input/output bus is connected between the first PMOS and NMOS transistors of each input circuit. Each inverter connected to the gate of the first NMOS transistor comprises a second NMOS transistor connected between that gate and ground; and in accordance with the invention the ratio of the width of the gate of the second NMOS transistor to the width of the gate of the first NMOS transistor of each of the input circuits is substantially the same.

In another aspect of the invention, a multi-fingered gate transistor is formed in a first well of one conductivity type that is surrounded by a second well of the same conductivity type from which it is separated by a ring comprising a shallow trench isolation region and a portion of the native substrate underneath the isolation region. The second well is used as a tap for the first well. As a result, the resistance in the substrate current path between well regions under the gate fingers and the well tap is increased significantly. However, the percentage of increase is higher for the gate fingers closer to the p-well tap than those in the center of the structure. This reduces the differences among the potentials in the well under the different source regions and thus improves the uniformity of turn-on of the parasitic bipolars under the gate fingers. A process for forming this structure is a further aspect of the invention. In particular, during the well-implant process a mask is used to create a native substrate region underneath the trench isolation region.

BRIEF DESCRIPTION OF THE DRAWINGS

These and other objects, features and advantages will be more readily apparent from the following Detailed Description in which.

DETAILED DESCRIPTION

Figure 4A:
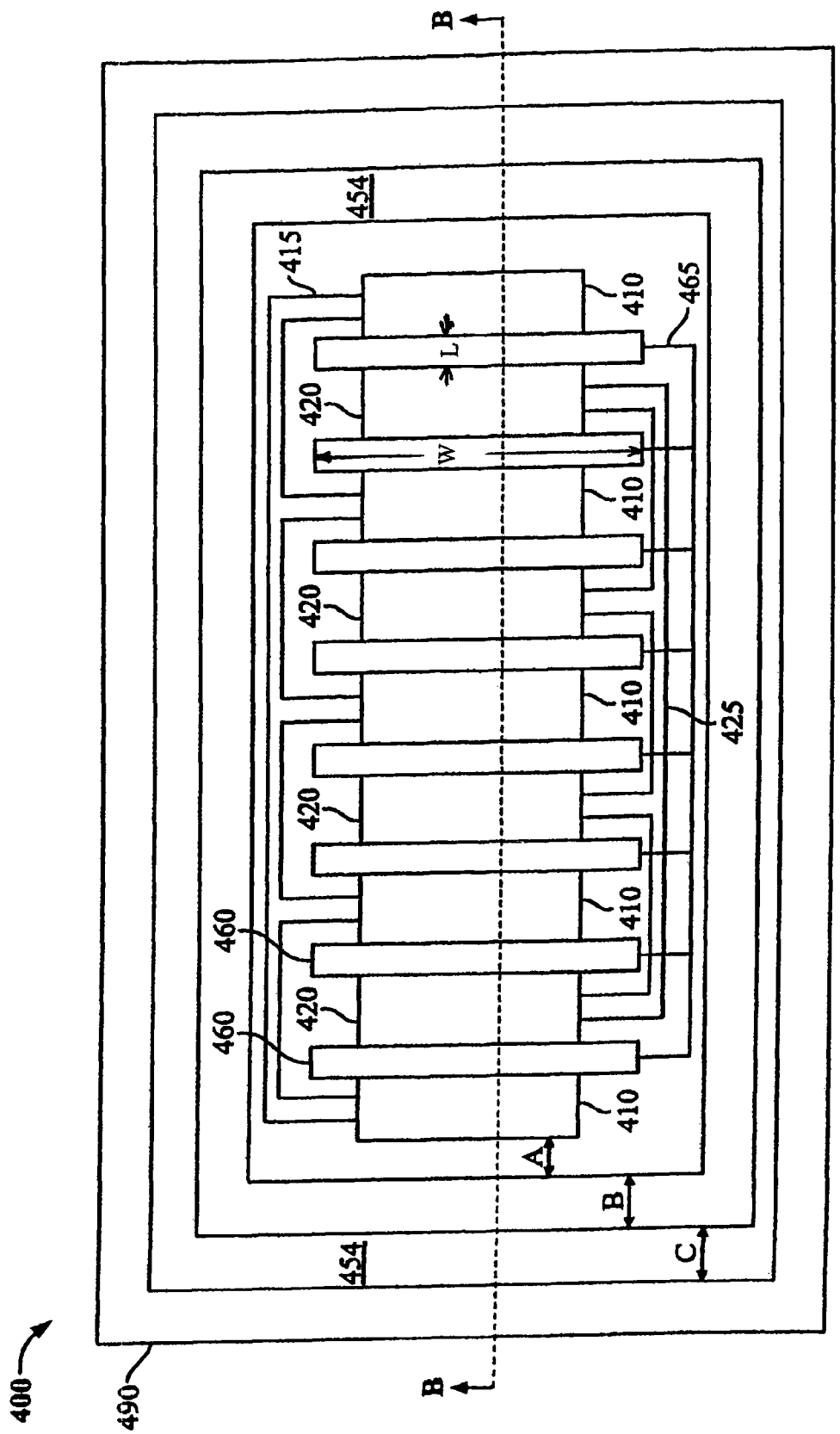
FIGS. 4A and 4B are a top view and a cross-sectional view of an illustrative multi-fingered gate transistor of the present invention.
Figure 4B:
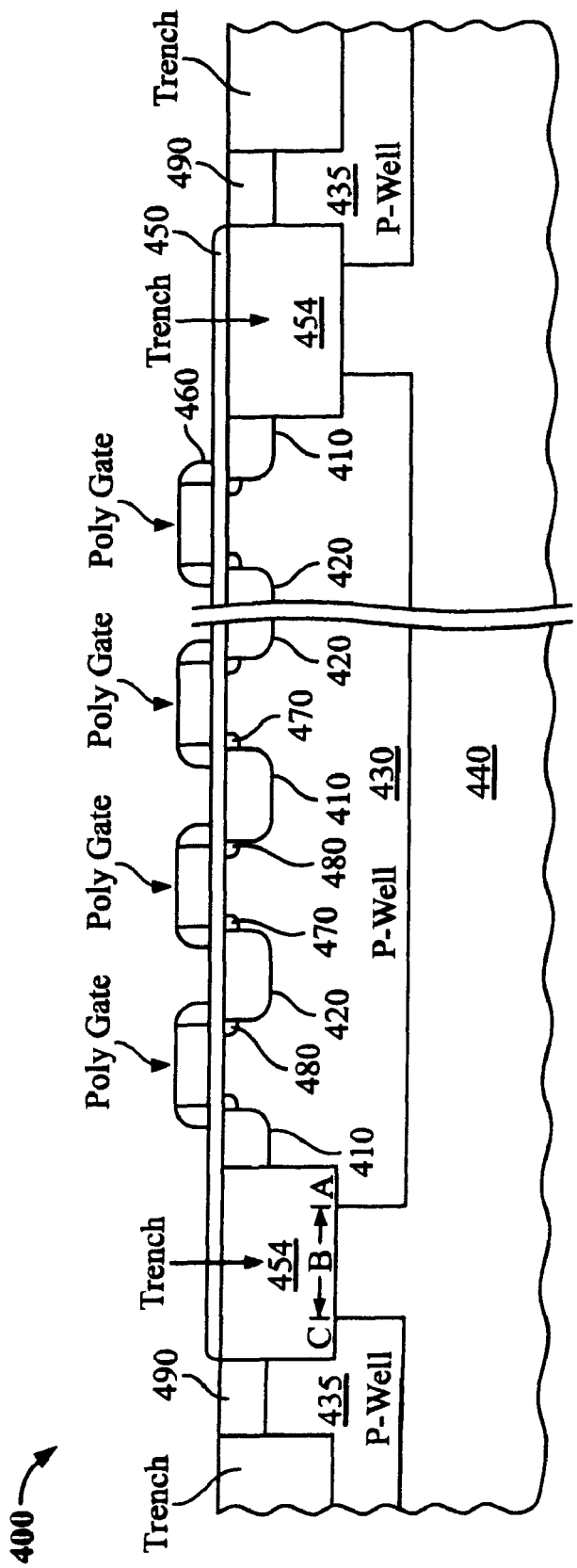

In accordance with one aspect of the invention, we have modified the structure of a multi-fingered MOS transistor so as to separate a well in which the transistor is formed from a well in which the tap is formed Preferably, the separation is accomplished by a narrow shallow trench isolation region and a portion of the native substrate underneath the isolation region. FIGS. 4A and 4B depict a top view and a cross-sectional view of a multi-fingered gate structure 400 formed in accordance with this aspect of the invention. The cross-section of FIG. 4B is taken along line B-B of FIG. 4A. For convenience, only four of the fingers of the device of FIG. 4A are shown in FIG. 4B. Structure 400 comprises N-type source and drain regions 410, 420 in a first P-well 430 in native substrate 440, an insulating layer 450 on the substrate and a multi-fingered gate 460 on the insulating layer. LDD regions 470, 480 extend part way under each gate finger. Structure 400 further includes a second P-well 435 that surrounds the first P-well on the periphery of the structure. P-well 435 is separated from P-well 430 by a shallow trench isolation region 454 and a portion of substrate 440 underneath isolation region 454. A connection is made to second P-well 435 at P-well tap 490. The source regions 410 are connected together by a connector 415 that is typically formed in a metallization layer on the IC; the drain regions are connected together by a connector 425 also formed in a metallization layer on the IC; and the gate fingers are connected together by a connector 465 also formed in a metallization layer on the IC. As a result, the source regions, drain regions and gate fingers are connected in parallel. Again, the dimension L is the gate length; and the dimension W is the width of a gate finger. Since the source regions, drain regions and fingers are connected in parallel, the total gate width of the transistor shown in FIG. 4A is 8 W.

Figure 2A:
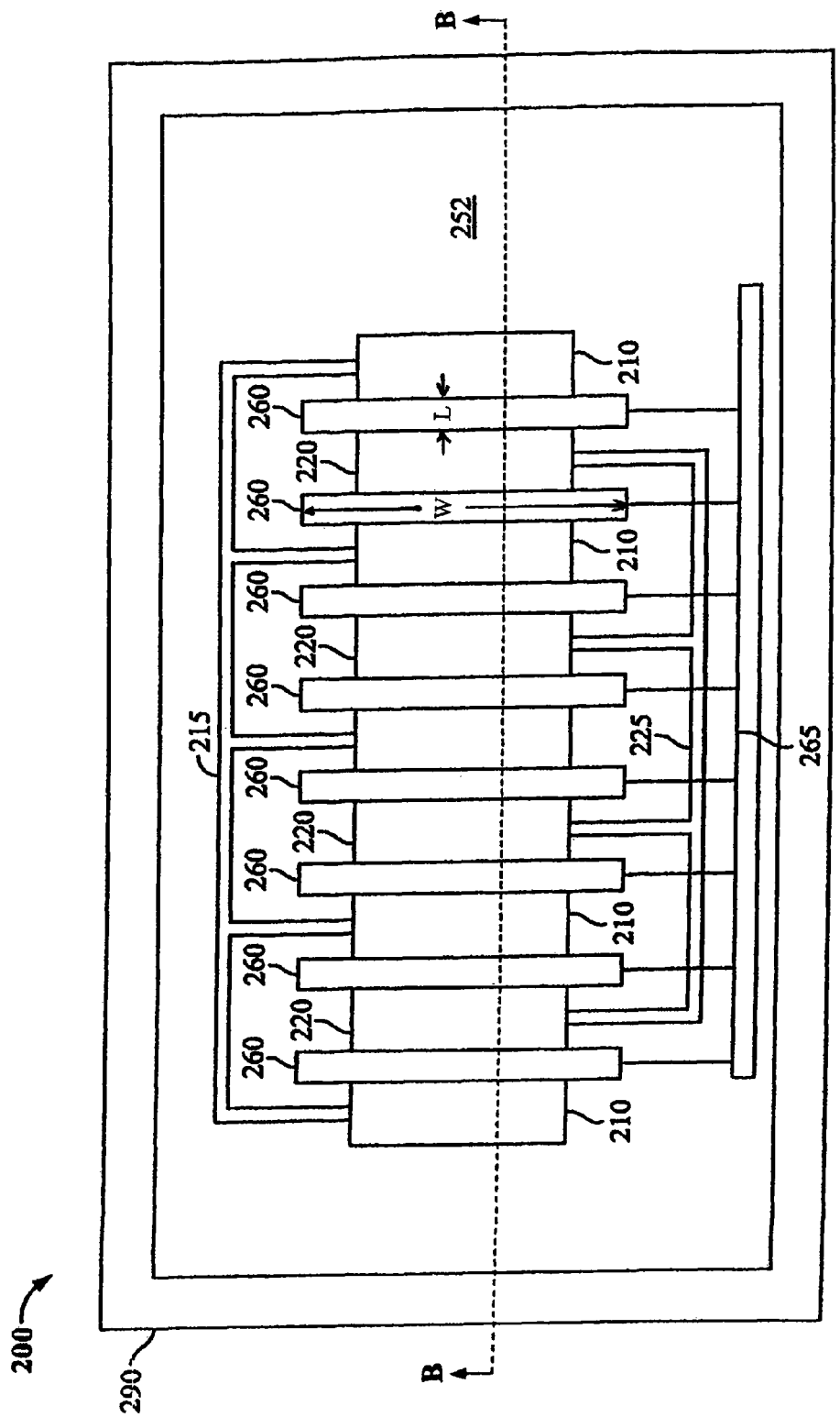
FIGS. 2A and 2B are a top view and a cross-sectional view of a prior art multi-fingered gate transistor.

As is known in the art, a P-well is formed by introducing dopants into a native P-type substrate. The dopants reduce the resistivity of the P-well relative to that of the P-type substrate. Thus, in current technologies the resistivity of the P-well may range from 0.05 to 0.1 ohm-cm. with 0.1 ohm-cm. being a typical value while the resistivity of native substrate 440 ranges from 1 to 20 ohm-cm. with 10 ohm-cm. being a typical value. As a result, the resistance of the portion of native substrate 440 that lies between first P-well 430 and second P-well 435 is considerably greater than what the resistance would be if that portion were part of the P-well; and the voltage drop across the portion of the native P-type substrate between the first and second P-wells is considerably greater than what it would be if that portion were part of the P-well. The design rules also make it possible to reduce the distance between the periphery of the N-type regions of the multi-fingered gate transistor and the P-well tap 490 while achieving a high enough potential in P-well 430 near the N-type source regions 410. In particular, the distance A+B+C shown in FIGS. 4A and 4B between the P-well tap and source region 410 can be approximately 1.1 micrometers (microns) compared with approximately 3 microns as in prior art structures such as shown in FIG. 2A. As a result, the size of the multi-fingered gate structure 400 can be reduced by more than 10%. In addition, because the resistance between P-well 435 and P-well 430 is increased, the differences in the potential of the well under the different source regions are reduced. Thus, more uniform triggering is achieved for the base-emitter junction of the parasitic bipolar transistor.

Figure 5:
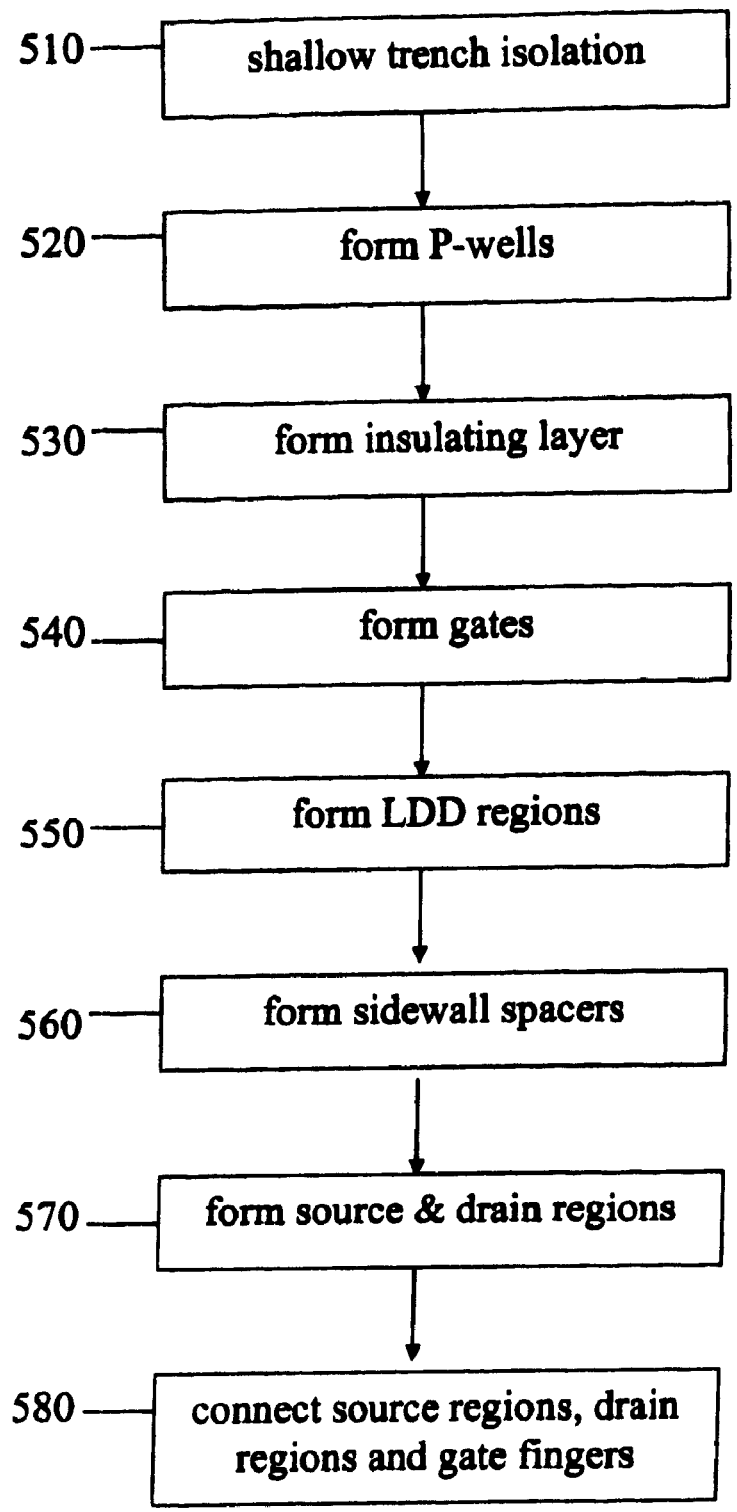
FIG. 5 is a flow chart detailing an illustrative process for making the transistor of FIGS. 4A and 4B.

A flowchart detailing an illustrative process for forming structure 400 is set forth in FIG. 5. The starting material is a native P-type substrate. Other processes not relevant to this invention may be performed before, during or after the processes described herein either on the same portions of the substrate or on different portions. For example, N-type wells may be formed in the substrate before the steps of FIG. 5 are performed; P-wells, gate structures and source and drain regions advantageously are formed on other portions of the substrate at the same time as such structures are formed according to the steps of FIG. 5 and interconnections will be formed to other structures at the same time as they are formed to the structures of the present invention.

At step 510, shallow trench isolation 454 is formed in substrate 440 using conventional processing methods. See, for example, S. A. Campbell, "The Science and Engineering of Microelectronic Fabrication," pp. 407-411 (2d Ed. Oxford, 2001) which is incorporated herein by reference. Illustratively, shallow trench isolation 454 is about 0.4 microns deep. P-type wells 430 and 435 are then formed at step 520 using a P-well mask that masks an annular region running through the center of the shallow trench isolation. In this step, P-type doping is done to the entire substrate except the region underneath the mask. As a result, wells 430 and 435 are formed separated by shallow trench isolation region 454 and by the portion of the substrate underneath the isolation region 454. An insulating layer 450 such as silicon dioxide is then formed on the surface of the substrate at step 530 and the multi-fingered gates are formed at step 540 using conventional lithographic processes. Next, at step 550 a lightly doped region is formed on either side of each gate finger using the gate fingers as a mask. Sidewall spacers are then formed at step 560 using conventional oxidation and etching techniques; and at step 570 N-type source and drain regions are formed using the gate fingers and sidewall spacers as masks. Illustratively, in current technologies, source and drain regions are about 0.1 micron deep. At step 580, the source regions are connected together; the drain regions are connected together; and the gate fingers are connected together.

In accordance with another aspect of the invention we have modified a circuit designed for use with multiple I/O standards so that there is a substantially constant ratio between the gate width of the inverter and that of the NMOS transistor in each input circuit. Circuit 600 depicts an illustrative embodiment of the invention comprising a plurality of input circuits 610A, 610B, ... 610N connected in parallel to a power supply bus 670, an input/output (I/O) bus 680 and ground 690. Each input circuit comprises a pair of inverters 620, 622, an NMOS transistor 650 and a PMOS transistor 660. NMOS transistor 650 is structurally similar to transistor 400 of FIGS. 4A and 4B and comprises an N-type source 651 and drain 652 in a P-type well and a gate 656. Source 651 is connected to ground 690 and drain 652 is connected to I/O bus 680. PMOS transistor 660 is structurally similar to transistor 400 but has opposite conductivity type. Thus, in addition to a gate 666, has P-type source and drain regions 661, 662 in an N-type well. Source 661 is connected to the power supply bus 670 and drain 662 is connected to I/O bus 680.

Figure 6:
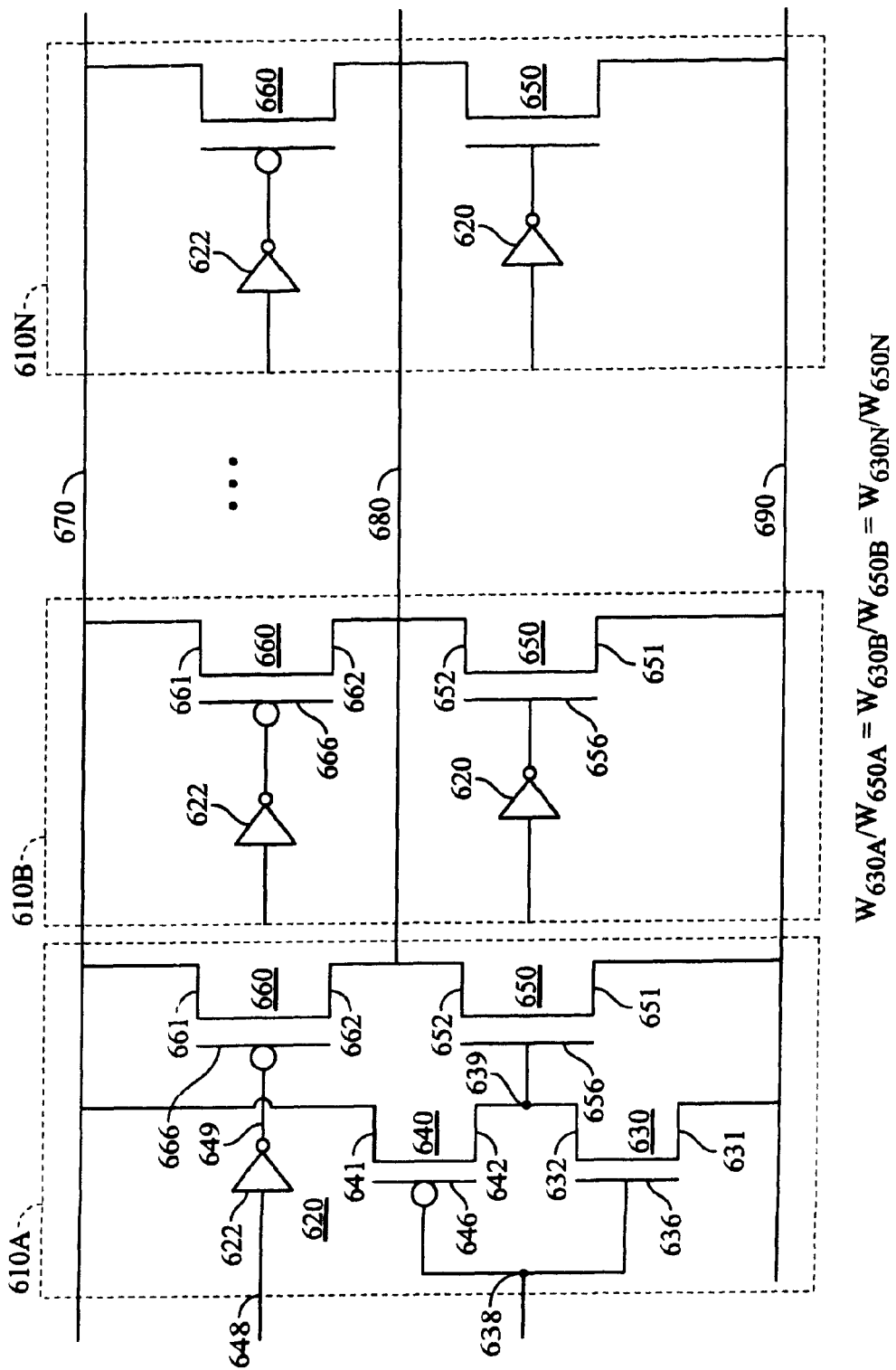
FIG. 6 is a circuit diagram for an illustrative embodiment of the invention.

Each of inverters 620, 622 typically comprises an NMOS transistor 630 and a PMOS transistor 640 connected in series between power supply bus 670 and ground 690. For convenience, only transistors 630 and 640 of inverter 620 are shown in FIG. 6. The transistors of inverter 622 will be understood to be similar. NMOS transistor 630 comprises a source 631, a drain 632 and a gate 636. Similarly, PMOS transistor 640 comprises a source 641, a drain 642 and a gate 646. Source 631 is connected to ground 690 and drain 632 is connected to an output node 639. Source 641 is connected to power supply bus 670 and drain 642 is connected to output node 639. Gates 636 and 646 are connected to an input node 638. Output node 639 is connected to gate 556 of NMOS transistor 650. Similarly, inverter 622 has an input node 648 connected to the gates of its PMOS and NMOS transistors and an output node 649 connected to gate 666 of PMOS transistor 660.

Figure 3:
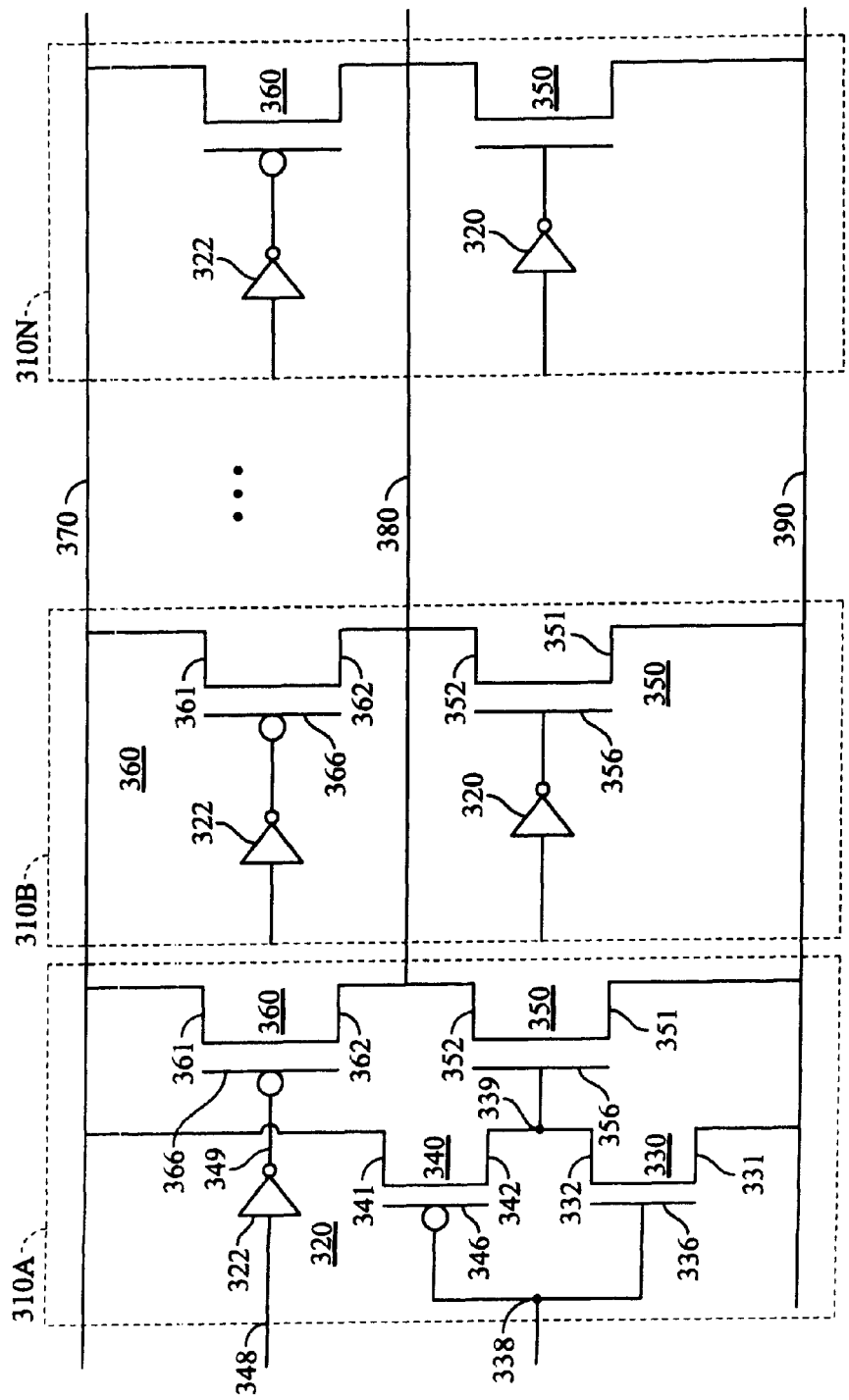
FIG. 3 is a circuit diagram for a portion of a prior art I/O circuit that supports multiple I/O standards.

As in the case of the prior art circuit of FIG. 3, the size of the NMOS and PMOS transistors in input circuits 610A, 610B, ... 610N is varied to accommodate different I/O standards; and this variation in size is achieved by varying the gate width of the transistors in the different input circuits. In accordance with the invention, the gate width of the NMOS transistors in inverter 620 in each input circuit 610A, 610B, ... 610N is also varied so the ratio of the width of NMOS transistor 630 to the width of the inverter 620 is substantially the same for each input circuit 610A 610B, ... 610N. Thus, $W_{630A}/W_{650A}=W_{630B}/W_{650B}= \ldots =W_{630N}/W_{650N}$ where $W_{630A}$ is the width of NMOS transistor 630 in input circuit 610A, $W_{650A}$ is the width of NMOS transistor 650 in input circuit 610A, and so on. This helps bring the same voltage coupling from the I/O bus 680 to the gates of NMOS transistors 650A, 650B, ..., and 650N. The voltage coupling leads to slight turn-on of the NMOS transistors for triggering their parasitic bipolar transistors. As a result, the ESD pulse is discharged through all the transistors. This has the effect of expanding the ESD protection capabilities of the circuit from what can be discharged through the one largest transistor to what can be discharged by all the transistors operating in parallel. In the case where the largest NMOS transistor 650 has a gate width that is approximately the sum of the gate widths of the NMOS transistors in all the other input circuits 610A, 610B, ... 610N, this expands the ESD protection capabilities of the circuit by a factor of two. At the same time, it also enables the width of the transistors in inverters 620, 622 to be reduced in proportion to the width of the MOS transistors to which they are connected. This results in a savings of up to 50% in the area of the integrated circuit that must be allocated to the inverters.

Figure 1:
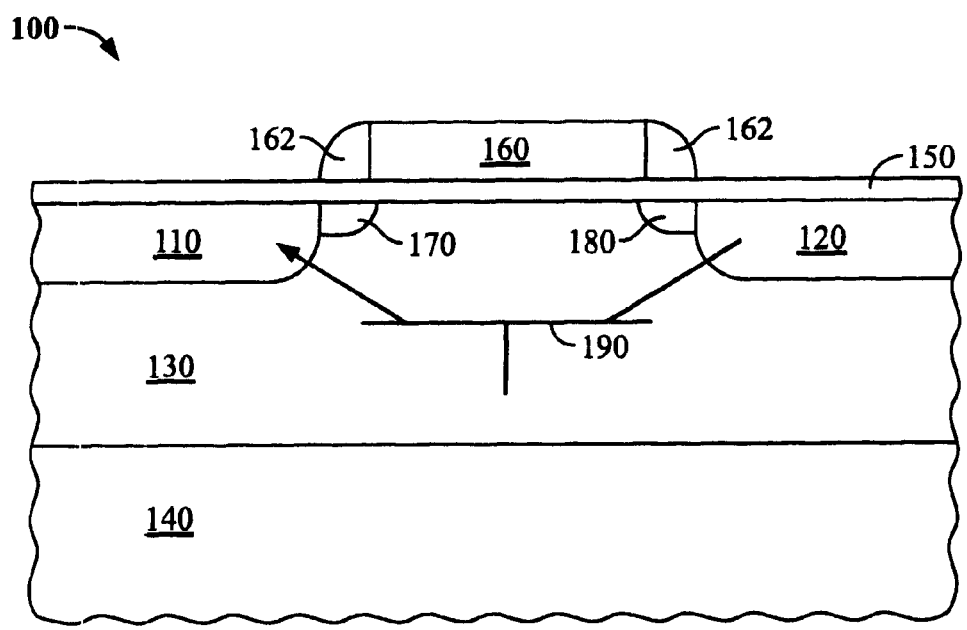
FIG. 1 is a schematic representation of a prior art NMOS transistor.
Figure 2B:
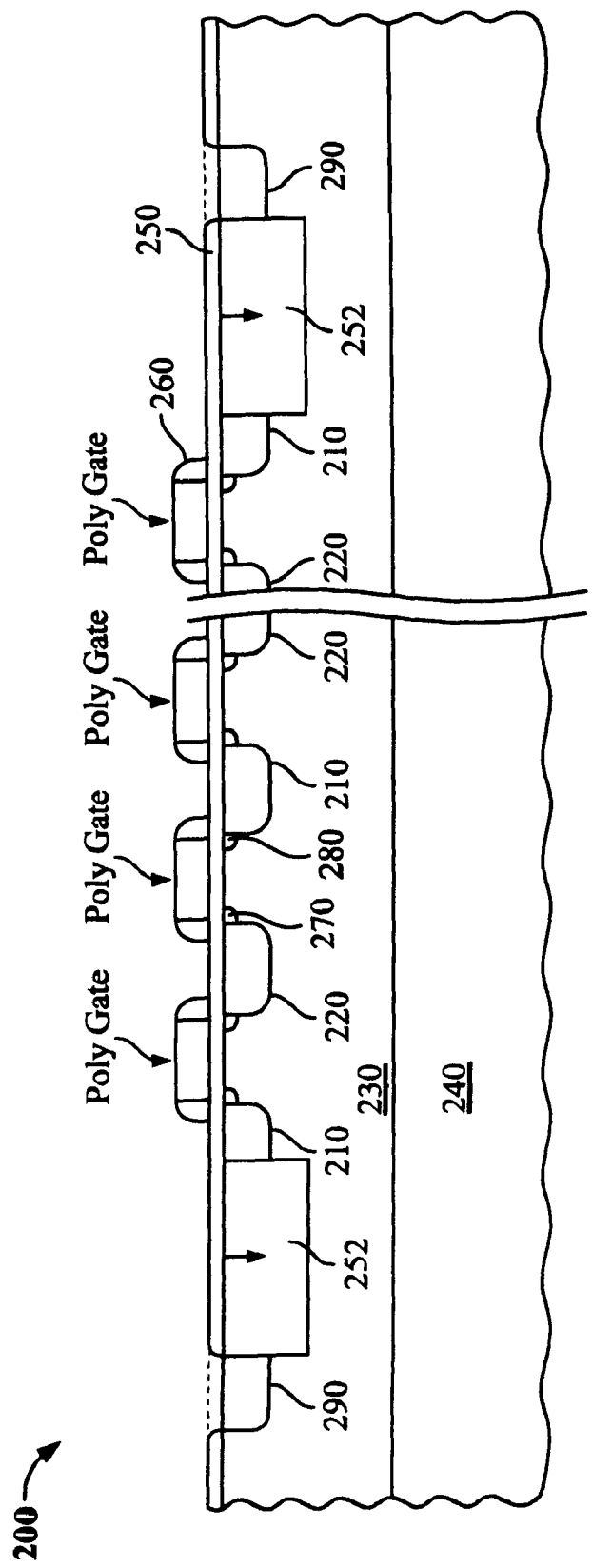

While circuit 600 has been described as using transistors having a structure similar to that of transistor 400 of FIGS. 4A and 4B, this aspect of the invention may also be practiced using prior art structures such as that of FIGS. 1, 2A and 2B where the deficiencies of such structures can be tolerated. Numerous other variations will be apparent to those skilled in the art. In some applications, substitution of PMOS structures for NMOS structures and vice versa may prove advantageous.

What is claimed is:

1. An electrostatic discharge (ESD) protection circuit structure comprising;
    a substrate;
    a first well extending into the substrate from a first surface of the substrate;
    a shallow trench isolation region surrounding the first well and extending from the first surface of the substrate to a region in the substrate that has a resistivity that is that of a native substrate;
    a second well extending into the substrate from the first surface of the substrate and surrounding the shallow trench isolation region;
    a transistor in the first well, said transistor comprising a plurality of gate fingers and a plurality of source and drain regions wherein the gate fingers extend parallel to one another on the first surface of the substrate and the source and drain regions are in the first well between the gate fingers; and
    a tap for the first well that is located in the second well at the first surface of the substrate.

2. The ESD protection circuit structure of claim 1 wherein the first and second wells have P-type conductivity.

3. The ESD protection circuit structure of claim 1 wherein the source and drain regions have N-type conductivity.

4. The ESD protection circuit structure of claim 1 wherein the first and second wells have N-type conductivity.

5. The ESD protection circuit structure of claim 1 wherein the source and drain regions have P-type conductivity.

6. The ESD protection circuit structure of claim 1 wherein the first and second wells are formed simultaneously.

7. An electrostatic discharge (ESD) protection circuit structure comprising;
    a substrate;
    a first well extending into the substrate from a first surface of the substrate;
    a shallow trench isolation region surrounding the first well and extending from the first surface of the substrate to a region in the substrate that has a resistivity in a range between 1 to 20 ohm-cm.;
    a second well extending into the substrate from the first surface of the substrate and surrounding the shallow trench isolation region;
    a transistor in the first well, said transistor comprising a plurality of gate fingers and a plurality of source and drain regions wherein the gate fingers extend parallel to one another on the first surface of the substrate and the source and drain regions are in the first well between the gate fingers; and
    a tap for the first well that is located in the second well at the first surface of the substrate.

8. The ESD protection circuit structure of claim 7 wherein the first and second wells have P-type conductivity.

9. The ESD protection circuit structure of claim 7 wherein the source and drain regions have N-type conductivity.

10. The ESD protection circuit structure of claim 7 wherein the first and second wells have N-type conductivity.

11. The ESD protection circuit structure of claim 7 wherein the source and drain regions have P-type conductivity.

12. The ESD protection circuit structure of claim 7 wherein the first and second wells are formed simultaneously.

13. The ESD protection circuit of claim 7 wherein the resistivity of the substrate is approximately 10 ohm-cm.

14. An electrostatic discharge (ESD) protection circuit structure comprising;
    a substrate;
    a first well extending into the substrate from a first surface of the substrate;
    a shallow trench isolation region surrounding the first well;
    a second well extending into the substrate from the first surface of the substrate and surrounding the shallow trench isolation region, the shallow trench isolation region extending to a region in the substrate that is not doped by either the first well or the second well;
    a transistor in the first well, said transistor comprising a plurality of gate fingers and a plurality of source and drain regions wherein the gate fingers extend parallel to one another on the first surface of the substrate and the source and drain regions are in the first well between the gate fingers; and
    a tap for the first well that is located in the second well at the first surface of the substrate.

15. The ESD protection circuit structure of claim 14 wherein the first and second wells have P-type conductivity.

16. The ESD protection circuit structure of claim 14 wherein the source and drain regions have N-type conductivity.

17. The ESD protection circuit structure of claim 14 wherein the first and second wells have N-type conductivity.

18. The ESD protection circuit structure of claim 14 wherein the source and drain regions have P-type conductivity.

19. The ESD protection circuit structure of claim 14 wherein the first and second wells are formed simultaneously.

* * * * *